United States Patent
Ueno et al.

(10) Patent No.: US 10,819,239 B2
(45) Date of Patent: Oct. 27, 2020

(54) SWITCHED-MODE POWER SUPPLY HAVING A LOAD INCREASE CIRCUIT

(71) Applicant: BROTHER KOGYO KABUSHIKI KAISHA, Nagoya-shi, Aichi-ken (JP)

(72) Inventors: Shiro Ueno, Ichinomiya (JP); Katsumi Inukai, Iwakura (JP); Hideki Arimoto, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 16/276,735

(22) Filed: Feb. 15, 2019

(65) Prior Publication Data

US 2019/0267902 A1 Aug. 29, 2019

(30) Foreign Application Priority Data

Feb. 28, 2018 (JP) ................. 2018-035925

(51) Int. Cl.
*H02M 3/335* (2006.01)
*G01R 19/165* (2006.01)
(Continued)

(52) U.S. Cl.
CPC .. *H02M 3/33507* (2013.01); *G01R 19/16528* (2013.01); *H02M 1/32* (2013.01);
(Continued)

(58) Field of Classification Search
CPC . H02M 2001/0032; H02M 2001/0035; H02M 1/36; H02M 5/293; H02M 3/33507; H02H 7/1252; H02H 7/127; H02H 9/04
See application file for complete search history.

(56) References Cited

U.S. PATENT DOCUMENTS

| 8,194,419 B2* | 6/2012 | Ryu | H02M 1/4208 363/21.04 |
| 2006/0171176 A1* | 8/2006 | Merilinna | H02M 3/33561 363/21.12 |

(Continued)

FOREIGN PATENT DOCUMENTS

| JP | 2001-238441 A | 8/2001 |
| JP | 2006-109581 A | 4/2006 |

(Continued)

*Primary Examiner* — Adolf D Berhane
*Assistant Examiner* — Lakaisha Jackson
(74) *Attorney, Agent, or Firm* — Scully, Scott, Murphy & Presser, PC

(57) ABSTRACT

A switched-mode power supply includes a transformer, a switching element, a switching controller, a voltage generator circuit, an overvoltage protection circuit, and a load increase circuit. The overvoltage protection circuit is configured to, when a first DC voltage outputted from the voltage generator circuit is below a predetermined voltage, apply a first drive voltage to an input terminal of the switching controller, and to, when the first DC voltage exceeds the predetermined voltage, apply a second drive voltage, which is different from the first drive voltage, to the input terminal, whereby the switching controller stops controlling switching operation. The load increase circuit is configured to, when the output voltage exceeds a threshold voltage, flow a current from the secondary side, thereby increasing a load applied to the secondary side. The threshold voltage is less than a rated voltage of the transformer and greater than the target voltage.

2 Claims, 3 Drawing Sheets

(51) Int. Cl.
*H02M 1/32* (2007.01)
*H01L 29/866* (2006.01)
*H02M 1/00* (2006.01)

(52) U.S. Cl.
CPC ....... *H02M 3/33523* (2013.01); *H01L 29/866* (2013.01); *H02M 2001/0006* (2013.01)

(56) References Cited

U.S. PATENT DOCUMENTS

2012/0162846 A1* 6/2012 Ohshima ................ H01H 47/10
　　　　　　　　　　　　　　　　　　　　　　361/160
2018/0006569 A1* 1/2018 Kikuchi ............ H02M 3/33507

FOREIGN PATENT DOCUMENTS

| JP | 2009-189103 A | 8/2009 |
| JP | 2009-195073 A | 8/2009 |
| JP | 2015-012709 A | 1/2015 |

* cited by examiner

SWITCHED-MODE POWER SUPPLY HAVING A LOAD INCREASE CIRCUIT

CROSS-REFERENCE TO RELATED APPLICATION

This application claims priority from Japanese Patent Application No. 2018-035925 filed on Feb. 28, 2018, the content of which is incorporated herein by reference in its entirety.

FIELD OF DISCLOSURE

Aspects described herein relate to a switched-mode power supply to control switching operation of a switching element connected to a primary winding of a transformer.

BACKGROUND

A typical switched-mode power supply includes a transformer, a switching element connected to the primary winding of the transformer, and an auxiliary winding located on the primary side of the transformer. The auxiliary winding carries a voltage corresponding to the output voltage on the secondary side of the transformer. If the voltage across the auxiliary winding exceeds a predetermined overvoltage detection level, the switched-mode power supply stops controlling the switching element to prevent an overload on the secondary side.

When the switched-mode power supply outputs a constant output voltage toward the secondary side, the magnitude of a load applied to an output destination (e.g., a printer) varies according to whether the printer having the switched-mode power supply is in operation of an image forming process. Depending on whether the load is constant or light, the coupling rate between the second winding and the auxiliary winding of the transformer varies. Thus, the voltage across the auxiliary winding under the light load is lower than that under the constant load.

A known switched-mode power supply detects whether an output load is light. When the load is light, the switched-mode power supply intermittently controls a switching element to change an overvoltage detection level.

SUMMARY

To appropriately perform overload protection on the secondary side, the above switched-mode power supply changes the overload detection level. However, for detection of light load and change of the overvoltage detection level, the switched-mode power supply additionally requires a load detection circuit to detect a light load, and a photocoupler to provide electrical isolation between the primary side and the secondary side and transmit the detection result of the load detection circuit to the primary side. This complicates a structure of the switched-mode power supply.

Illustrative aspects described herein provide a switched-mode power supply that can appropriately perform overvoltage protection on the secondary side under both a light-load condition and a constant-load condition, without the need for a complicated structure.

According to one or more aspects described herein, a switched-mode power supply includes a transformer, a switching element, a switching controller, a voltage generator circuit, an overvoltage protection circuit, and a load increase circuit. The transformer has a primary side and a secondary side. The transformer includes a primary winding on the primary side, a secondary winding on the secondary side, and an auxiliary winding on the primary side. The secondary winding is connected to a load device. The switching element is connected to the primary winding of the transformer. The switching controller includes an input terminal. The switching controller is configured to control switching operation of the switching element such that an output voltage on the secondary side of the transformer becomes a target voltage. The voltage generator circuit is located on the primary side of the transformer. The voltage generator circuit is configured to rectify and smooth an alternating current (AC) voltage induced to the auxiliary winding and output the rectified and smoothed AC voltage. The rectified and smoothed AC voltage is a first direct current (DC) voltage. The overvoltage protection circuit is located on the primary side of the transformer. The overvoltage protection circuit is configured to, when the first DC voltage is below a predetermined voltage, generate a first drive voltage from the first DC voltage and apply the first drive voltage to the input terminal. When the first DC voltage exceeds the predetermined voltage, the overvoltage protection circuit generates a second drive voltage, which is different from the first drive voltage, and apply the second drive voltage to the input terminal, whereby the switching controller stops controlling the switching operation. The load increase circuit is located on the secondary side of the transformer. The load increase circuit is configured to, when the output voltage exceeds a threshold voltage, flow a current from the secondary side of the transformer, thereby increasing a load applied to the secondary side of the transformer. The threshold voltage is less than the rated voltage of the transformer and greater than the target voltage.

When the first DC voltage is below a predetermined value, the overvoltage protection circuit generates the first drive voltage from the first DC voltage, and applies the first drive voltage to the input terminal of the switching controller. The switching controller is driven by the first drive voltage applied to the input terminal.

The output voltage at the secondary side of the transformer may become excessively high, resulting in an overvoltage, which increases the AC voltage induced in the auxiliary winding, causing the first DC voltage to exceed a predetermined value. When the first DC voltage exceeds the predetermined value, the overvoltage protection circuit applies the second voltage to the input terminal of the switching controller. In response to this, the switching controller stops the switching operation of the switching element.

Thus, the switched-mode power supply can perform overvoltage protection by stopping the switching operation of the switching element.

The switched-mode power supply includes the load increase circuit. When the output voltage exceeds the threshold voltage, in other words, when an overvoltage is likely to occur, the load increase circuit flows the current from the secondary side of the transformer to increase the load to be applied to the load device from the light load to the constant load in advance. This enhances the coupling rate described above and increases the voltage outputted from the output terminal of the transformer, thus enabling increase in the AC voltage induced in the auxiliary winding. Thus, the switched-mode power supply can reliably perform the overvoltage protection by stopping the switching operation of the switching element, irrespective of whether it is under a light-load condition or a constant-load condition. The above described method minimizes the need to complicate the structure of the switched-mode power supply.

According to one or more aspects described herein, the switched-mode power supply can appropriately perform overvoltage protection on the secondary side under both a light-load condition and a constant-load condition, without the need for a complicated structure.

DETAILED DESCRIPTION

An illustrative embodiment disclosed herein will be described with reference to the accompanying drawings.

Circuit Outline of the Embodiment

Figure 1:
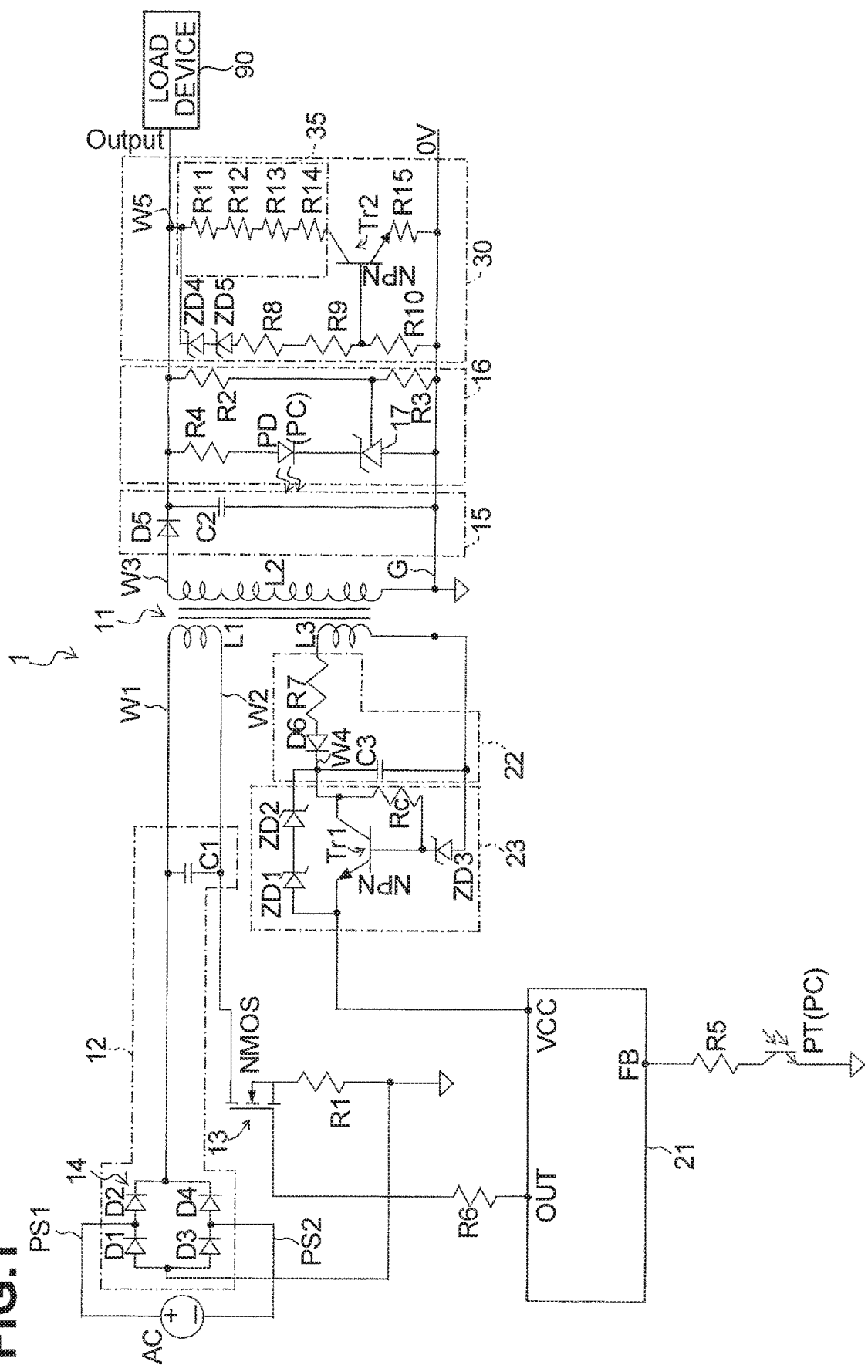
FIG. 1 is a circuit diagram of a switched-mode power supply according to an illustrative first embodiment disclosed herein.

FIG. 1 shows a circuit configuration of a switched-mode power supply according to a first embodiment. In FIG. 1, the switched-mode power supply 1 is configured to convert an AC (alternating current) voltage supplied via feed lines PS1, PS2 from an AC mains electricity to a DC (direct current) voltage. In this embodiment, the switched-mode power supply 1 is mounted in an electronic device, for example, a printer. The switched-mode power supply 1 includes a transformer 11 having a primary side illustrated on the left and a secondary side illustrated on the right. The transformer 11 includes a primary winding L1 on the primary side and a secondary winding L2 on the secondary side. The transformer 11 further includes an auxiliary winding L3 on the primary side.

Structure on Primary Side (1)

The switched-mode power supply 1 includes a primary-side rectifier and smoothing circuit 12 and a switching element 13 on the primary side of the transformer 11.

Primary-Side Rectifier and Smoothing Circuit

The primary-side rectifier and smoothing circuit 12 includes a diode bridge 14 and a smoothing capacitor C1.

The diode bridge 14 is an arrangement of four diodes D1, D2, D3, and D4 in a bridge circuit configuration. More specifically, the diode bridge 14 has a series circuit of two diodes D1, D2 and another series circuit of two diodes D3, D4, which are connected to each other in parallel. The series circuit of two diodes D1, D2 has a connection point connected to the feed line PS1, while the other series circuit of two diodes D3, D4 has a connection point connected to the feed line PS2. One connection point between the series circuit D1, D2 and the series circuit D3, D4 is connected via the wire W1 to an end, which is illustrated as an upper end, of the primary winding L1. The other one connection point is grounded.

The smoothing capacitor C1 has one electrode connected to the wire W1 and the other electrode connected to the wire W2.

An AC voltage supplied from the AC mains electricity is rectified by the diode bridge 14 for the full-wave rectification, the rectified voltage is smoothed by the smoothing capacitor C1, and thus a DC voltage is generated between the wires W1, W2.

Switching Element

The switching element 13 is connected to the primary winding L1 of the transformer 11. The switching element 13 is a N-channel, metal-oxide-semiconductor field-effect transistor (NMOSFET) and has a drain terminal connected to the wire W2. The switching element 13 has a source terminal connected via resistor R1 to the diodes D1 and D3 of the diode bridge 14. The switching element 13 has a gate terminal and performs switching operation (on and off) based on the voltage applied to the gate terminal.

When the switching element 13 is switched on, the current flows through the primary winding L1 of the transformer 11, and energy accumulates in the primary winding L1. When the switching element 13 is switched off, energy accumulating in the primary winding L1 is released, and electromotive force is generated in the primary winding L2, which thus induces, in the secondary winding L2, a secondary voltage corresponding to the ratio of the number of turns of the primary winding L1 compared to the secondary winding L2. The secondary voltage is induced in the form of a sequence of pulses obtained by repeatedly switching the switching element 13 on and off.

Structure on Secondary Side (1)

The switched-mode power supply 1 includes, on the secondary side of the transformer 11, a secondary-side rectifier and smoothing circuit 15 and a constant voltage circuit 16.

Secondary-Side Rectifier and Smoothing Circuit

The secondary-side rectifier and smoothing circuit 15 includes a rectifier diode D5 and a smoothing capacitor C2. The secondary winding L2 of the transformer 11 has one end, which is illustrated as an upper end, connected via the wire W3 to an output terminal (Output), and the other end, which is illustrated as a lower end, connected to a ground line G indicated with "0V." The rectifier diode D5 is located in a portion of the wire W3 with its anode connected to the end of the secondary winding L2. The smoothing capacitor C2 has one electrode connected to a portion of the wire W3 closer to the cathode of the rectifier diode D5 and the other electrode connected to the ground line G. The secondary voltage induced in the secondary winding L2 in the form of a sequence of pulses is rectified and smoothed through the secondary-side rectifier and smoothing circuit 15, and thus converted into a DC voltage.

Constant Voltage Circuit

The constant voltage circuit 16 includes a shunt regulator integrated circuit (IC) 17, resistors R2, R3, R4, and a photocoupler PC. The resistors R2, R3 are connected in series. A series circuit of the resistors R2 and R3 has one end connected to the wire W3 and the other end connected to the ground line G. The shunt regulator IC 17 has a reference voltage. An output voltage outputted from the output terminal (Output) is divided by the resistors R2 and R3 and inputted into the shunt regulator IC 17 as a feedback voltage. The photocoupler PC includes a light-emitting diode (LED) PD. The LED PD has an anode connected via the resistor R4 to the wire W3 and a cathode connected to the shunt regulator IC 17. This configuration allows a constant voltage to be outputted from the output terminal (Output) to a load device 90 connected to the output terminal. When the feedback voltage exceeds the reference voltage, the LED PD of the photocoupler PC emits light.

Structure on Primary Side (2)

The switched-mode power supply 1 includes a switching controller 21 on the primary side of the transformer 11. The switching controller 21 consists of an IC in which a CPU and other components are integrated, and which includes a first terminal FB, a second terminal OUT, and a third terminal VCC. The third terminal VCC is an example of an input terminal.

The photocoupler PC has a receiver, that is, a phototransistor PT connected via the resistor R5 to the first terminal FB. When, on the secondary side, the feedback voltage exceeds the reference voltage and the LED PD of the photocoupler PC emits light, the phototransistor PT is conducting, and the voltage is input to the first terminal FB. The current flowing through the LED PD increases or decreases depending on a potential difference between the feedback voltage and the reference voltage on the secondary side. As the current flowing through the phototransistor PT varies with the light emitted from the LED PD, the voltage applied to the first terminal FB varies.

The second terminal OUT of the switching element 21 is connected via the resistor R6 to the gate terminal of the switching element 13. The switching controller 21 is configured to control the duty ratio of the switching operation of the switching element 13 based on an input voltage at the first terminal FB which varies in response to the feedback voltage on the secondary side. This control maintains the feedback voltage on the secondary side constant as a target voltage.

Structure on Primary Side (3)

The switched-mode power supply 1 includes a voltage generator circuit 22 and an overvoltage protection circuit 23 on the primary side of the transformer 11.

Voltage Generator Circuit

The voltage generator circuit 22 includes a rectifier diode D6, a resistor R7 and a smoothing capacitor C3. The auxiliary winding L3 of the transformer 11 has an end, which is illustrated as an upper end, connected to a wire W4 as an example of an output line. The rectifier diode D6 is located in a portion of the wire W4 with its anode connected to the end of the auxiliary winding L3. The resistor R7 is located between the anode of the rectifier diode D6 and the end of the auxiliary winding L3. The smoothing capacitor C3 has one electrode connected to a portion of the wire W4 closer to the cathode of the rectifier diode D6 and the other electrode connected to the ground line G. When the secondary voltage is induced in the secondary winding L2 in the form of a sequence of pulses, the AC voltage is induced in the auxiliary winding L3 in the form of a sequence of pulses. The AC voltage induced in the auxiliary winding L3 is rectified and smoothed through the rectifier diode D6 and the smoothing capacitor C3, and thus outputted as a DC voltage. The outputted DC voltage is an example of a first DC voltage.

Overvoltage Protection Circuit

The voltage generator circuit 23 includes a NPN transistor Tr1, and three Zener diodes ZD1, ZD2, ZD3. The NPN transistor Tr1 has a collector connected to the wire W4. The NPN transistor Tr1 has an emitter connected to the third terminal VCC of the switching controller 21. The Zener diodes ZD1, ZD2 are connected in series, in which the Zener diode ZD2 has a cathode connected to the collector of the NPN transistor Tr1, and the Zener diode ZD1 has an anode connected to the emitter of the NPN transistor Tr1. The Zener diode ZD3 has a cathode connected to the base of the NPN transistor Tr1 and an anode connected to the auxiliary winding L3. The collector of the NPN transistor Tr1 and the cathode of the Zener diode ZD3 sandwich a resistor Rc.

Basic Operation of Switched-Mode Power Supply

In the above structure, when the voltage outputted from the output terminal (Output) of the transformer 11 is steady, the DC voltage is applied to the wire W4, the current flows through the Zener diode ZD3 and the resistor Rc, and a constant voltage is applied to the third terminal VCC of the switching controller 21 as a first drive voltage. The first drive voltage is obtained by reducing the voltage applied between the base and emitter of the NPN transistor Tr1 from a breakdown voltage of the Zener diode ZD3.

In the event of an error in the switched-mode power supply 1, for example, a failure in the photocoupler PC, the switching controller 21 fails to control the normal switching operation of the switching element 13, and the switching element 13 performs switching operation at the maximum duty ratio. In this state, the voltage outputted from the output terminal starts to rise, the voltage induced in the auxiliary winding L3 starts to rise responsively, and thus the DC voltage in the wire W4 starts to rise. The rise in the DC voltage in the wire W4 allows the Zener diodes ZD1, ZD2 to become electrically conductive, and thus a voltage obtained by subtracting a breakdown voltage of the Zener diodes ZD1, ZD2 from the DC voltage in the wire W4 is applied to the third terminal VCC of the switching controller 21 as a second drive voltage. The second drive voltage is greater than the first drive voltage. When the second drive voltage is applied to the third terminal VCC, or when the voltage applied to the third terminal VCC exceeds a predetermined voltage, which may cause the output voltage on the secondary side of the transformer 11 to exceed a rated voltage of the transformer 11, the switching controller 21 triggers an overload protection function, to stop the switching operation of the switching element 13 and lower the voltage outputted from the output terminal. The predetermined voltage is an example of a second drive voltage.

Coupling Rate Between Secondary Winding and Auxiliary Winding

When the switched-mode power supply 1 outputs a constant output voltage toward the secondary side, the magnitude of a load applied to the load device 90, which is connected to the secondary winding L2, for example, a printer, varies according to whether a load is applied to the load device 90, for example, whether the printer is operated for image formation. Depending on that the load is constant or light, the coupling rate between the secondary winding L2 and the auxiliary winding L3 of the transformer 11 varies. When the load is constant or under a constant-load condition, the current flows to both the load device 90 and the load increase circuit 30. When the load is light or under a light-load condition, the current flows to the load device 90, but no load flows to the load increase circuit 30.

Figure 2:
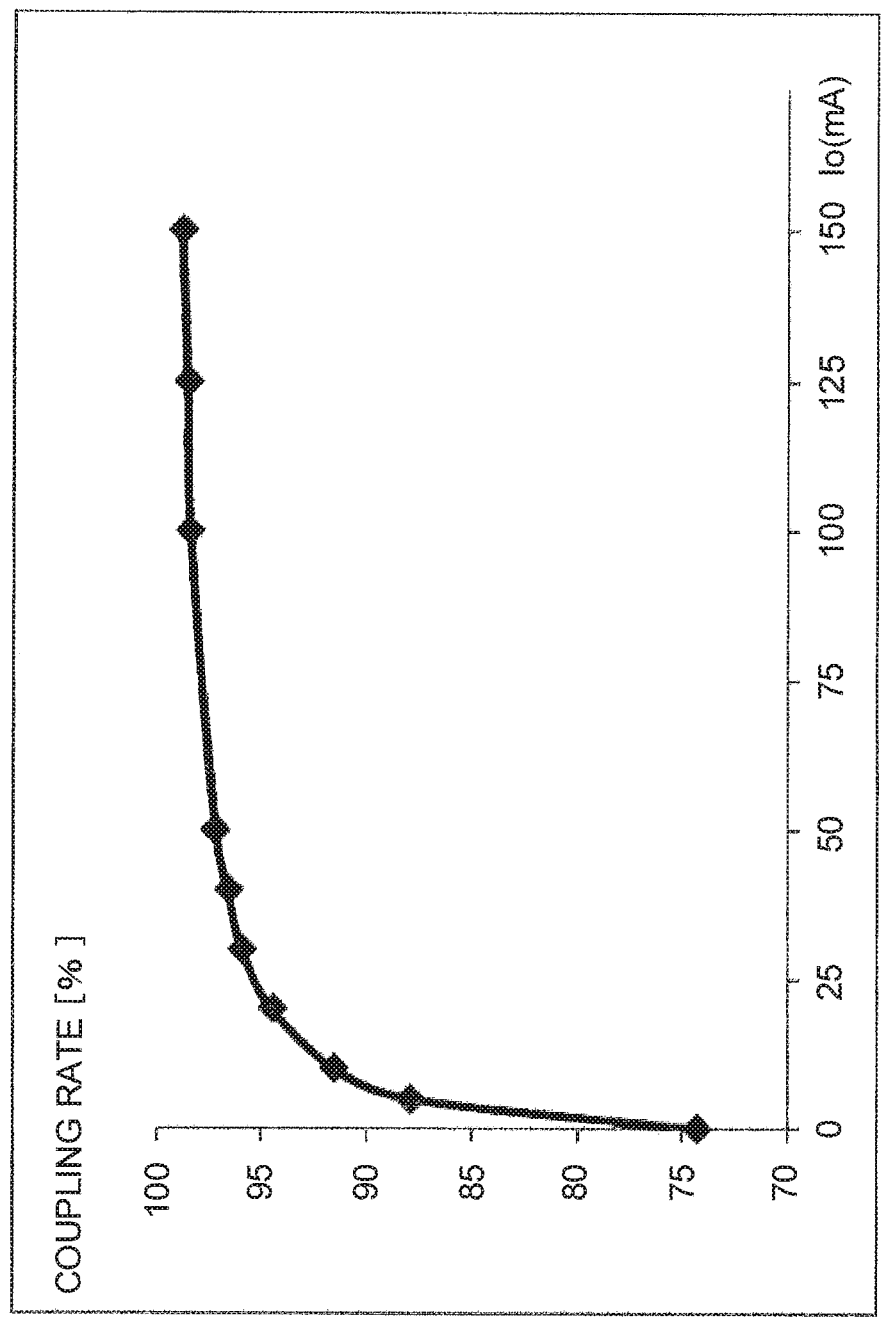
FIG. 2 is a graph showing a change in coupling rate between a secondary winding and an auxiliary winding of a transformer.

FIG. 2 is a graph showing a change in the coupling rate between the secondary winding L2 and the auxiliary winding L3 of the transformer 11, with the horizontal axis representing an output current value Io from the output terminal on the secondary side. The value Io corresponds to the magnitude of a load. In the right of the graph of FIG. 2, where the value Io ranges between 100 and 150 mA, the coupling rate is 98% or more and substantially constant. The smaller than 100 mA the value Io is, toward the left in FIG. 2, the more gently the coupling rate lowers. When the value Io is 50 mA, the coupling rate is approximately 97%. The smaller than 50 mA the value Io is, the more sharply the coupling rate drops. More specifically, when the value Io is 30 mA, the coupling rate is approximately 96%, the value Io being 20 mA with the coupling rate approximately 94.5%, the value Io being 10 mA with the coupling rate approximately 91.5%, the value Io being 5 mA with the coupling rate approximately 88%, the value Io being 0 mA with the coupling rate approximately 74%.

Thus, the coupling rate between the secondary winding L2 and the auxiliary winding L3 of the transformer 11 decreases with smaller load applied to the secondary side of the transformer 11. Under a light-load condition, a greater output voltage outputted from the output terminal of the transformer 11 fails to lead to a greater AC voltage induced to the auxiliary winding L3, and thus the voltage applied to the third terminal VCC of the switching controller 21 hardly exceeds the predetermined voltage, or the second drive voltage is hardly applied to the third terminal VCC. Thus, the switching controller 21 is unable to stop the switching operation of the switching element 13, that is, unable to trigger the overload protection function, which may result in that the output voltage on the secondary side of the transformer 11 exceeds the rated voltage of the transformer 11.

Structure on Secondary Side (2)

To avoid the above problem, the switched-mode power supply 1 further includes a load increase circuit 30 on the secondary side of the transformer 11.

Load Increase Circuit

The load increase circuit 30 includes a load circuit 35, a NPN transistor Tr2, and a resistor R15. The load circuit 35 is connected via an output wire W5 to the wire W3. The NPN transistor Tr2 is connected to the load circuit 35 opposite the output wire W5. The NPN transistor Tr2 is an example of a relay.

The load circuit 35 includes a plurality of, for example, four, resistors R11, R12, R13, R14 in series. A series circuit of the resistors R11, R12, R13, R14 has one end connected to the output wire W5 and the other end connected to a collector of the NPN transistor Tr2. The NPN transistor Tr2 has an emitter connected via the resistor R15 to the ground line G.

The load increase circuit 30 includes two Zener diodes ZD4, ZD5 in series, and three resistors R8, R9, R10 in series. The Zener diode ZD4 has a cathode connected to the output wire W5. The Zener diode ZD5 has an anode connected to one end of the series circuit of the resistors R8, R9, R10. The other end of the series circuit of the resistors R8, R9, R10 is connected to the ground line G. The NPN transistor Tr2 has a base to which a voltage at a connection point between the resistors R9, R10 is applied. Thus, the anode of the Zener diode ZD5 is connected via the resistors R8, R9 to the base of the NPN transistor Tr2.

The output voltage on the secondary side of the transformer 11 gradually increases and exceeds a breakdown voltage of the Zener diodes ZD4, ZD5 in the load increase circuit 30. When the output voltage on the secondary side of the transformer 11 exceeds the breakdown voltage of the Zener diodes ZD4, ZD5, the current flows through the Zener diodes ZD4, ZD5. The current is supplied to the base of the NPN transistor Tr2 and thus the NPN transistor Tr2 turns on. The breakdown voltage of the Zener diodes ZD4, ZD5 is less than the rated voltage of the transformer 11 and greater than the target voltage. As the breakdown voltage of the Zener diodes ZD4, ZD5 is less than the rated voltage of the transformer 11, the NPN transistor Tr2 turns on before the output voltage on the secondary side of the transformer 11 is raised to the rated voltage of the transformer 11, thereby avoiding the output voltage on the secondary side reaching the rated voltage.

When the NPN transistor Tr2 turns on, a current from the secondary side of the transformer 11 flows from the collector of the NPN transistor Tr2 via the resistors R11, R12, R13, R14. Thus, the current flowing through the resistors R11, R12, R13, R14 allows increase in load to be applied to the secondary side of the transformer 11.

Effects

The value of the AC voltage to be induced in the auxiliary winding L3 may vary with whether the load device 90, which is an output destination, carries a light load or constant load. Thus, the breakdown voltage, corresponding to an overvoltage detection level, of the Zener diodes ZD1, ZD2 needs to be changed based on whether the load device 90 carries a light load or constant load.

As described above, however, the switched-mode power supply 1 includes the load increase circuit 30. When the output voltage on the secondary side of the transformer 11 exceeds the breakdown voltage of the Zener diodes ZD4, ZD5, the load increase circuit 30 flows the current from the secondary side of the transformer 11, thereby increasing the load to be applied to the secondary side. More specifically, even when the load device 90 carries a light load, the circuit 30 enables switching from the light load to the constant load before an overload occurs. This enhances the coupling rate and increases the voltage outputted from the output terminal of the transformer 11, thus enabling increase in the AC voltage induced in the auxiliary winding L3. Where the load device 90 is under any of light-load condition and constant-load condition, the switching controller 21 can stop the switching operation control to perform the overvoltage protection function, without the need as in prior art to change the overvoltage detection level in the overvoltage protection circuit 23 (or the breakdown voltage of the Zener diodes ZD1, ZD2). The above described method of switching the magnitude of a load minimizes the need to complicate the structure of the switched-mode power supply compared to a conventional method of changing an overload detection level in response to detection of whether it is a light load.

In this embodiment, especially when the output voltage on the secondary side of the transformer 11 exceeds the breakdown voltage of the Zener diodes ZD4, ZD5, the load increase circuit 30 increases the load applied to the secondary side of the transformer 11 through the current flowing from the secondary side of the transformer 11. The breakdown voltage of the Zener diodes ZD4, ZD5 is an example of a threshold voltage. In the load increase circuit 30, one end of the secondary winding L2 is connected via the output wire W5 to the load circuit 35, and the NPN transistor Tr2 is connected to the load circuit 35 opposite the output wire W5. Thus, the load increase circuit 30 determines whether to flow the current from the secondary side of the transformer 11 through the load circuit 35 depending on the NPN transistor Tr2 turning on or off. When the output voltage on the secondary side of the transformer 11 exceeds the breakdown voltage of the Zener diodes ZD4, ZD5, the NPN transistor Tr2 turns on. This configuration allows the current from the secondary side of the transformer 11 to flow through the load circuit 35.

The embodiment illustrates that the Zener diodes ZD4, ZD5 are connected to the base of the NPN transistor Tr2, and when the output voltage on the secondary side of the transformer 11 exceeds the breakdown voltage of the Zener diodes ZD4, ZD5, the current flows through the Zener diodes ZD4, ZD5. When the current flows through the base of the NPN transistor Tr2, the NPN transistor Tr2 turns on. In other words, the current supplied via the load circuit 35 from the secondary side of the transformer 11 flows from the collector of the NPN transistor Tr2.

The load circuit 35 includes the resistors R11, R12, R13, R14 between the output wire W5 and the collector of the NPN transistor Tr2. When the NPN transistor Tr2 turns on, the current from the secondary side of the transformer 11 flows through the resistors R11, R12, R13, R14. Thus, the load on the secondary side increases.

Modification

The following describes a modification. It is noted that elements similar to or identical with those described in the above embodiment are designated by similar numerals, and thus the description thereof can be omitted for the sake of brevity. The following description will be made mainly as to different points from the above embodiment.

The modification illustrates an example to increase a load by driving a motor.

Figure 3:
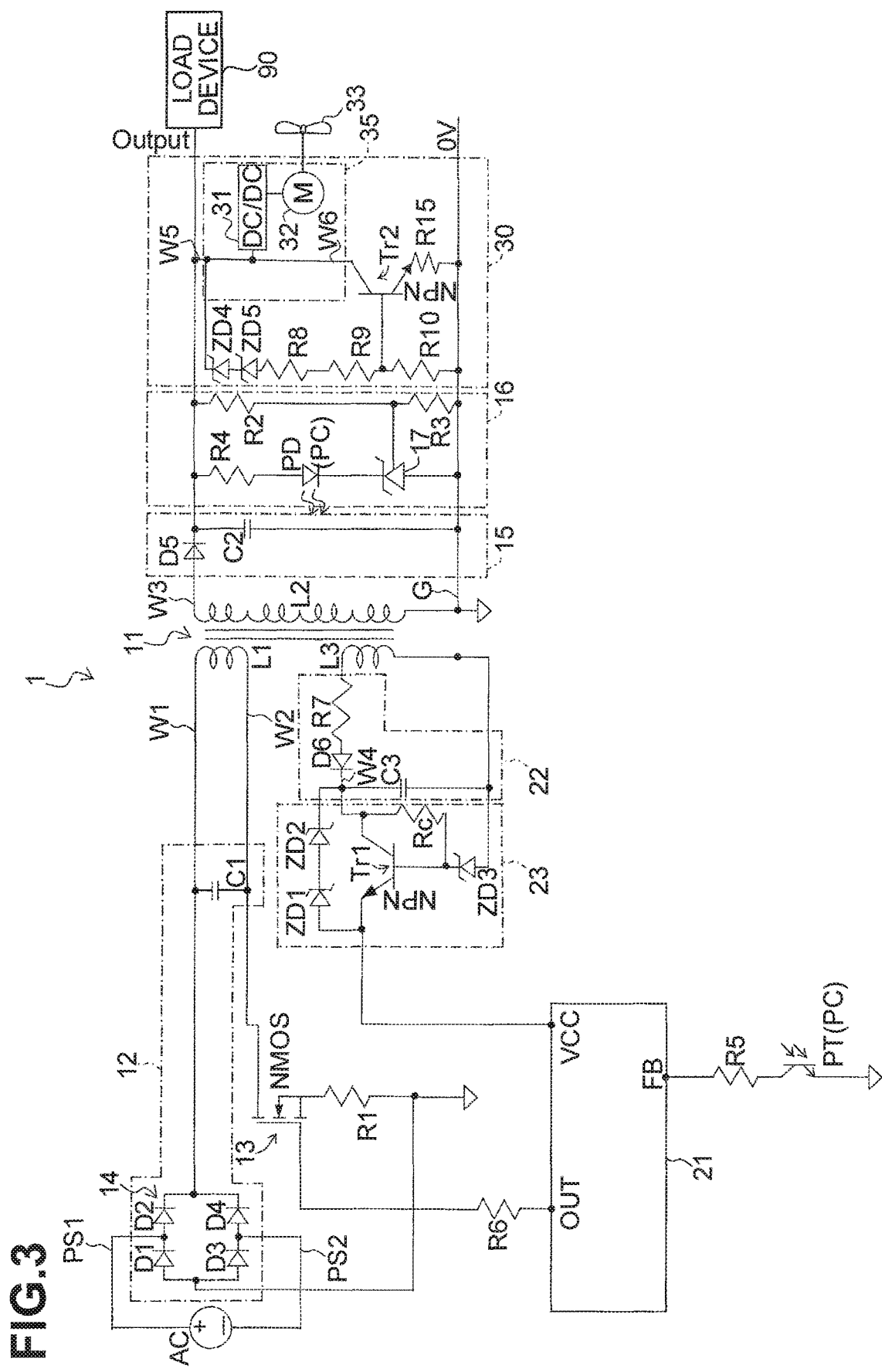
FIG. 3 is a circuit diagram of a switched-mode power supply to increase a load by driving a motor according to a modification.

FIG. 3 is a circuit diagram of a switched-mode power supply according to the modification. As illustrated in FIG. 3, the load increase circuit 30 of the modification includes a direct current to direct current (DC-DC) converter 31 instead of the resistors R11, R12, R13, R14. The DC-DC converter 31 is connected to a wire W6. The wire W6 has one end connected to the output wire W5 and the other end connected to the collector of the NPN transistor Tr2. The DC-DC converter 31 is connected to a motor 32 that drives a fan 33 for sending air to, for example, some locations in a printer. As described above, when the NPN transistor Tr2 turns on, the current from the secondary side of the transformer 11 flows via the wire W6 to the DC-DC converter 31 and the motor 32, and the motor 32 drives the fan 33 to rotate.

In the modification as in the above embodiment, when the output voltage on the secondary side of the transformer 11 exceeds the threshold voltage or an overvoltage is likely to occur, the current flows from the secondary side of the transformer 11 to the motor 32 to switch from the light-load condition to the constant-load condition in advance. More specifically, when the NPN transistor Tr2 turns on, the current from the secondary side of the transformer 11 flows via the wire W6 through the DC-DC converter 31, and thus the motor 32 is driven to increase the load on the secondary side. This enhances the coupling rate and stops the switching control, resulting in reliable performance of the overload protection function, as in the above embodiment.

According to the modification, when the output voltage on the secondary side of the transformer 11 exceeds the threshold voltage, the current from the secondary side of the transformer 11 drives the fan 33. Where the overvoltage occurs, the printer may have a portion under abnormal condition, causing heating, typically. According to the modification, the driven fan 33 sends air to cool such a heating portion.

The switched-mode power supply 1 may be used by combining methods described above appropriately.

The above embodiment and modification are merely examples. Various changes, arrangements and modifications may be applied therein without departing from the spirit and scope described herein.

What is claimed is:

1. A switched-mode power supply, comprising:
a transformer having a primary side and a secondary side, the transformer including a primary winding on the primary side, a secondary winding on the secondary side, and an auxiliary winding on the primary side, the secondary winding being connected to a load device at one end and to a ground line at the other end;
a switching element, which is a NMOSFET having a drain terminal connected to the primary winding of the transformer;
a switching controller including an input terminal and an output terminal, the output terminal of the switching controller being connected to a gate terminal of the NMOSFET, the switching controller being configured to control current into the gate terminal of the NMOSFET for activating a switching operation of the switching element such that an output voltage of the secondary winding of the transformer reaches a target voltage;
a voltage generator circuit connected to the auxiliary winding of the transformer, the voltage generator circuit being configured to rectify and smooth an alternating current (AC) voltage induced to the auxiliary winding and output the rectified and smoothed AC voltage, wherein the rectified and smoothed AC voltage is a first direct current (DC) voltage;
an overvoltage protection circuit connected to the voltage generator circuit, the input terminal of the switching controller and the auxiliary winding of the transformer, the overvoltage protection circuit being configured to, when the first DC voltage is below a predetermined voltage, generate a first drive voltage from the first DC voltage and apply the first drive voltage to the input terminal of the switching terminal, the overvoltage protection circuit being further configured to, when the first DC voltage exceeds the predetermined voltage, generate a second drive voltage, which is different from the first voltage, and apply the second drive voltage to the input terminal of the switching terminal, whereby the switching controller stops the switching operation; and
a load increase circuit located between the secondary winding of the transformer and the load device, the load increase circuit being configured to, when the output voltage of the secondary winding of the transformer exceeds a particular voltage less than a rated voltage of the transformer and greater than the target voltage, increase a load of the load increase circuit,
wherein
the load increase circuit includes a NPN transistor, a load circuit and a resistor, the load circuit including a first series of resistors and being connected to a collector of the NPN transistor at one end and to the load device at the other end, the resistor being connected to an emitter of the NPN transistor at one end and to the ground line at the other end,
the load increase circuit further includes a Zener diode, a second series of resistors, a cathode of the Zener diode being connected to the load device, the second series of resistors being connected to an anode of the Zener diode at one end and to the ground line at the other end, a base of the NPN transistor being connected to a connection point between one resistor and another resistor in the second series of resistors,
the particular voltage being a breakdown voltage of the Zener diode, and
when the output voltage of the secondary winding of the transformer exceeds the breakdown voltage of the Zener diode, a current flows into the base of the NPN transistor such that a current flows through the first series of the resistors and the resistor via the collector and the emitter of the NPN transistor, thereby increasing the load of the load increase circuit.

2. A switched-mode power supply, comprising:
a transformer having a primary side and a secondary side, the transformer including a primary winding on the primary side, a secondary winding on the secondary side, and an auxiliary winding on the primary side, the secondary winding being connected to a load device at one end and to a ground line at the other end;

a switching element, which is a NMOSFET having a drain terminal connected to the primary winding of the transformer;

a switching controller including an input terminal and an output terminal, the output terminal of the switching controller being connected to a gate terminal of the NMOSFET, the switching controller being configured to control current into the gate terminal of the NMOSFET for activating a switching operation of the switching element such that an output voltage of the secondary winding of the transformer reaches a target voltage;

a voltage generator circuit connected to the auxiliary winding of the transformer, the voltage generator circuit being configured to rectify and smooth an alternating current (AC) voltage induced to the auxiliary winding and output the rectified and smoothed AC voltage, wherein the rectified and smoothed AC voltage is a first direct current (DC) voltage;

an overvoltage protection circuit connected to the voltage generator circuit, the input terminal of the switching controller and the auxiliary winding of the transformer, the overvoltage protection circuit being configured to, when the first DC voltage is below a predetermined voltage, generate a first drive voltage from the first DC voltage and apply the first drive voltage to the input terminal of the switching terminal, the overvoltage protection circuit being further configured to, when the first DC voltage exceeds the predetermined voltage, generate a second drive voltage, which is different from the first voltage, and apply the second drive voltage to the input terminal of the switching terminal, whereby the switching controller stops the switching operation; and a load increase circuit located between the secondary winding of the transformer and the load device, the load increase circuit being configured to, when the output voltage of the secondary winding of the transformer exceeds a particular voltage less than a rated voltage of the transformer and greater than the target voltage, increase a load of the load increase circuit, wherein the load increase circuit includes a NPN transistor, a load circuit and a resistor, the load circuit includes a DC to DC converter, a motor, and a fan, the DC to DC convertor being connected to a collector of the NPN transistor at one end and to the load device at the other end, the motor being connected to the DC to DC converter, the fan being connected to the motor, the resistor being connected to an emitter of the NPN transistor at one end and to the ground line at the other end, the load increase circuit further includes a Zener diode, a second series of resistors, a cathode of the Zener diode being connected to the load device, the second series of resistors being connected to an anode of the Zener diode at one end and to the ground line at the other end, a base of the NPN transistor being connected to a connection point between one resistor and another resistor in the second series of resistors, the particular voltage being a breakdown voltage of the Zener diode, and when the output voltage of the secondary winding of the transformer exceeds the breakdown voltage of the Zener diode, a current flows into the base of the NPN transistor such that a current flows through the DC to DC converter and the resistor via the collector and the emitter of the NPN transistor, thereby increasing the load of the load increase circuit.

* * * * *